United States Patent [19]

Strickland

[11] Patent Number: 4,467,288
[45] Date of Patent: Aug. 21, 1984

[54] DISTORTION-FREE COMPLEMENTED ERROR FEEDBACK AMPLIFIER AND METHOD

[76] Inventor: James C. Strickland, 1595 NE. 175 St., N. Miami Beach, Fla. 33162

[21] Appl. No.: 337,290

[22] Filed: Jan. 5, 1982

[51] Int. Cl.$^3$ .......................... H03F 1/26; H03F 1/34
[52] U.S. Cl. ................................... 330/149; 330/271; 330/99
[58] Field of Search ................... 330/82, 104, 99, 149, 330/264, 271

[56] References Cited

U.S. PATENT DOCUMENTS 3,469,202  9/1969  Priddy ................................. 330/104
4,125,813  11/1978  Cubbison, Jr. ...................... 330/104

Primary Examiner—James B. Mullins
Assistant Examiner—G. Wan
Attorney, Agent, or Firm—Ziems, Walter & Shannon

[57] ABSTRACT

A distortion-free amplifier in accordance with the present invention includes an input amplifier, an output amplifier and method, and a cooperative combination of negative and positive feedback loops that remove substantially all distortion and error in the amplified output. Negative feedback loops are provided around the output amplifier and the input/output amplifier combination to provide degenerative error reduction. The negative feedback loop around the output stage provides a portion of the output to a voltage node at which the error component of the output signal is inversely superposed on the inverted signal to be amplified. This highly "visible" (inverse, intra-loop) error component is utilized as positive feedback to provide a regeneratively enhanced error pre-correction of the signal in the input amplifier. The pre-correction can be precisely controlled to effect virtually complete serial cancellation of the to-be-introduced error as the signal is propagated through the amplifier.

16 Claims, 3 Drawing Figures

DISTORTION-FREE COMPLEMENTED ERROR FEEDBACK AMPLIFIER AND METHOD

BACKGROUND OF THE INVENTION

The present invention relates to electrical signal amplification and, more particularly, to electrical signal amplification in which the error introduced into the amplified signal is effectively cancelled by a combination of positive and negative feedback to provide a distortion-free amplified output.

The classic amplifier topologies co-evolved with the development of vacuum tubes and continued through the development of bipolar transistors and, most recently, the development of MOS transistors. It was early recognized that non-linearities of the active devices in single ended amplifiers and differences between the active devices in symmetrical circuit configurations contributed to the distortion of the amplified output.

Circuits have been developed to reduce or eliminate the error and distortion components and have included error feed-forward techniques and the almost universal negative feedback technique. In the error feed-forward technique, a portion of the amplified output signal from a primary amplifier is subtracted from the input signal, leaving only the distortion component which is then amplified by a separate 'error' amplifier to provide an amplified distortion signal that is then combined with the output of the primary amplifier to effect additive cancellation between the amplified distortion from the error amplifier and the distortion component of the primary amplified signal. While it is possible that all amplifier error can be completely nulled using the feed-forward technique, a separate error amplifier is required as well as very precise control of the relative gain of the separate amplifiers. Negative or degenerative feedback provides for the return of a fraction of the error-containing output signal in reverse phase to the input signal so that the reverse phase feedback effectively reduces the error introduced as the signal is propagated through the amplifier.

In comparison to the feed-forward techniques, degenerative feedback achieves generally acceptable error reduction at relatively low cost. Where high accuracy distortion-free amplification is required, the negative feedback technique has practical limitations since increased amounts of negative feedback can lead to amplifier instability and other undesirable feedback-related drawbacks including a decrease in the sonic quality of the amplifier.

SUMMARY OF THE INVENTION

In view of the above, it is a broad overall object of the present invention to provide an amplifier topology and method of amplification by which a distortion-free output is obtained.

It is a further object of the present invention to provide an amplifier topology and method of amplification well suited for amplification in the audio-frequency range having improved quantitative and qualitative performance properties.

It is still another object of the present invention to provide an amplifier topology and method by which error introduced during amplification is cancelled by a complementary combination of degenerative and regenerative feedback.

It is still another object of the present invention to provide an amplifier topology and method utilizing voltage-controlled transconductive devices configured to have anisotropic transfer characteristics, that is, forward voltage gain with unity 'reverse' gain output properties.

It is another object of the present invention to provide a distortionless amplifier having a voltage node that includes an enhanced error signal that can be utilized to effect complemented error nulling.

In accordance with these objects and others, the present invention provides a distortion-free amplifier topology and method by which an input signal is amplified through a first amplifier and presented to an output amplifier stage for power amplification. A portion of the amplified output signal is fed back as negative feedback to the input of the power amplifier stage to effect degenerative error reduction in the known manner. A voltage node is created in the circuit to which the degeratively fed-back signal is provided with this nodal signal being further fed back to the input of the input amplifier as positive feedback so as to regeneratively enhance the output error relative to the signal to be amplified and to pre-correct the input signal to effect serial cancellation of the to-be-introduced distortion as the signal is propogated through the amplifier. The regeneratively enhanced error permits complete cancellation of the distortion and error 'residual' not reduced by the degenerative feedback.

In an all MOSFET preferred embodiment of the present invention, the signal to be amplified is presented to one input of a differential amplifier with the other input receiving an error signal in the form of both negatively and positively fed back signals. The output of the differential amplifier is provided to a bilateral current source stage, driving a voltage node at its drain connection. The bilateral current source stage drives a power output stage defined by symetrically configured power MOSFETs of complementary type biased for class AB amplification. A portion of the amplified output, containing the error to be corrected, is fed back to the bilateral current source output (voltage node) and also to the other input to the differential input amplifier to effect conventional degenerative feedback error reduction. The signal at the voltage node, which includes the signal to be amplified by the power output stage and the output error contribution, is fed back as positive, regenerative feedback to the other input of the differential amplifier so that input signal to be amplified is pre-corrected with a regeneratively enhanced error signal to effect serial cancellation of the to-be-introduced error as the signal is propagated through the amplifier. By providing "complemented" regenerative and degenerative feedback, it is possible to reduce the error by degenerative feedback and then serially cancel the residuum of error not eliminated by the negative feedback.

The use of a bilateral current source stage driving the afore-described voltage node caused by the feedback around the output stage allows the voltage at the voltage node to be representative of the actual current through both the output stage and load and provides a highly beneficial modification of the transfer characteristics of the common source output stage by providing the output stage with full forward voltage gain and the appearance of unity gain when viewed from the load, thereby preserving both the desirable properties of a source follower and the full voltage gain of a common source circuit.

The inventive amplifier provides essentially distortion-free output since all errors introduced into the signal as it is amplified are reduced by negative feedback with the error residual not reduced by the negative feedback removed by serial cancellation with the regeneratively enhanced pre-correction signal. In practice, the preferred embodiment of the amplifier circuit has demonstrated outstanding qualitative and quantitative performance including superior sonic performance in the audio frequency range.

BRIEF DESCRIPTION OF THE DRAWINGS

The above description, as well as the objects, features, and advantages of the present invention will be more fully appreciated by reference to the following detailed description of a presently preferred but nonetheless illustrative embodiment in accordance with present invention when taken in conjunction with the accompanying drawings wherein.

DESCRIPTION OF THE PREFERRED EMBODIMENTS

Figure 1:
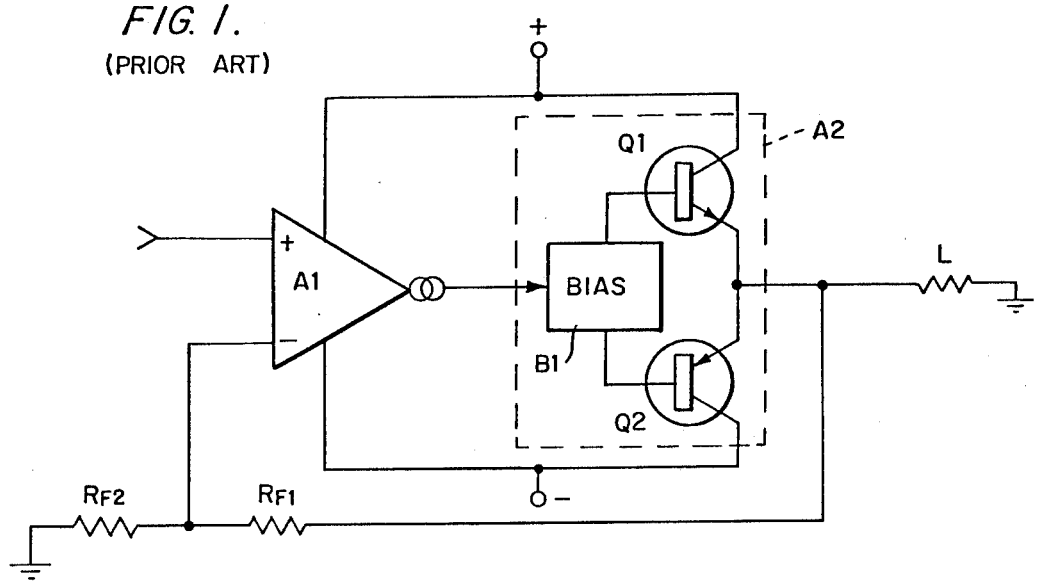
FIG. 1 is a schematic block diagram of a conventional transistor amplifier topology employing negative feedback to effect error reduction.
Figure 2:
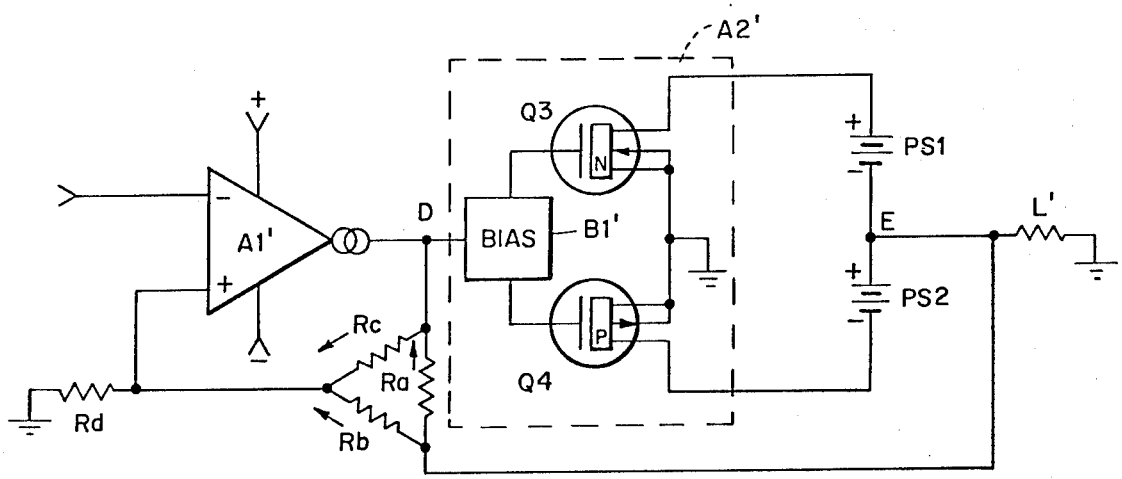
FIG. 2 is a schematic block diagram of a transistor amplifier topology in accordance with the present invention utilizing complemented degenerative and regenerative feedback to provide an error-free amplified output.
Figure 3:
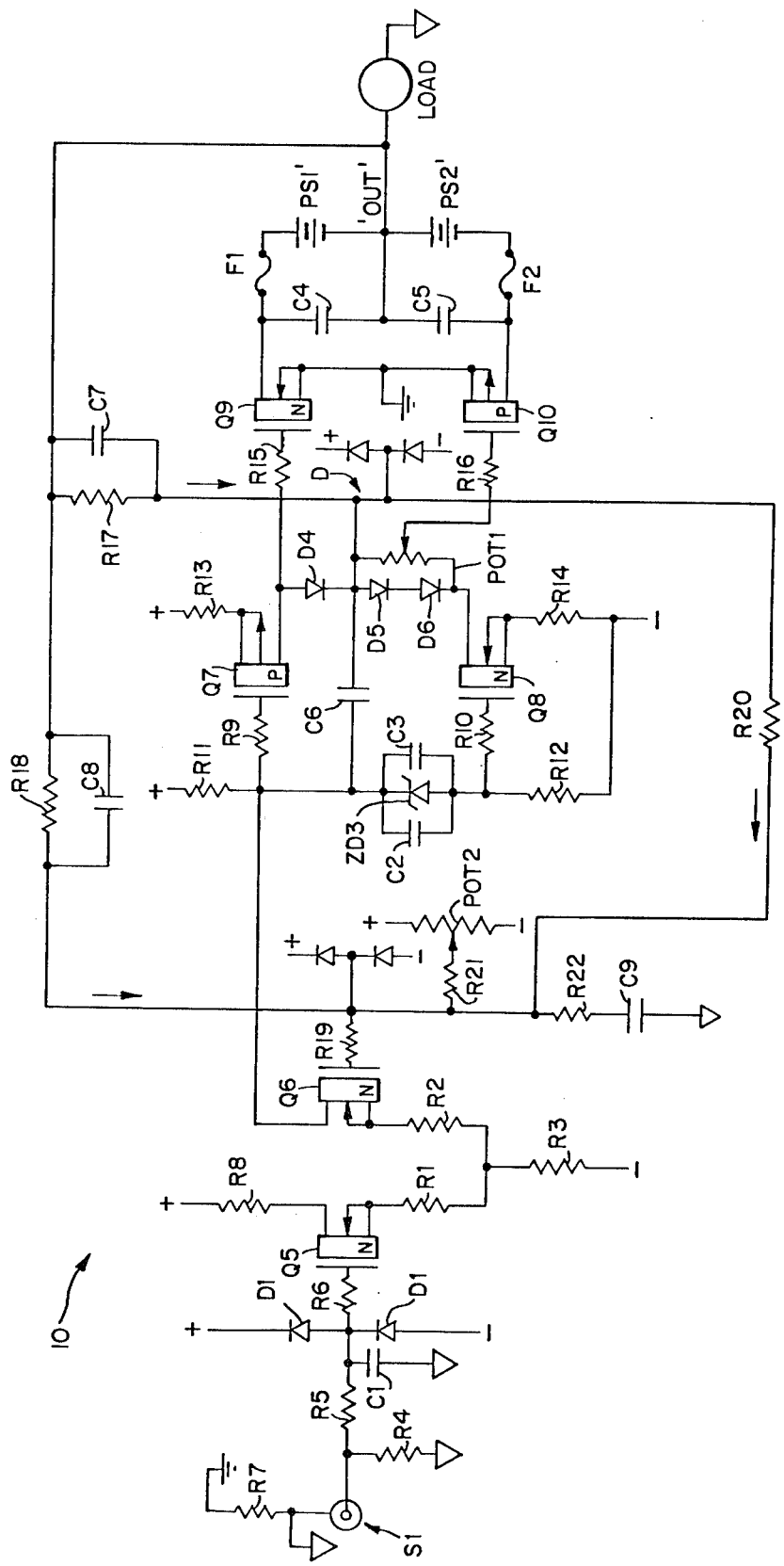
FIG. 3 is a circuit diagram of a preferred embodiment of an amplifier topology in accordance with the present invention.

The block diagram of FIG. 1 illustrates a classic transistor amplifier topology, the block diagram of FIG. 2 conceptually illustrates an amplifier topology in accordance with the present invention, and the circuit diagram of FIG. 3 illustrates a preferred embodiment of an amplifier circuit in accordance with the present invention.

As shown in FIG. 1, the classic amplifier topology includes an input current source amplifier A1 having a non-inverting input that receives the signal to be amplified and which drives an output stage A2 that includes complementary bipolar output transistors Q1 and Q2 in a push/pull configuration with the output transistors Q1 and Q2 biased by appropriate inter-base biasing circuitry B1. Typically, the output transistors Q1 and Q2 are biased for class AB operation. The load L is connected to the emitters of the output transistors Q1 and Q2 with current provided through the load L in accordance with the current flowing through the emitter junctions of the output transistors Q1 and Q2 as controlled by the signal from the input amplifier A1. As is known in the art, the minor portion of the error or distortion in the output signal is introduced by the input amplifier A1, which typically operates as a linear, class A amplifier, and a major portion of the distortion or error in the output signal is introduced by the output amplifier A2, with the principal error contributions caused by non-linearities in the output transistors Q1 and Q2, differences in the operating characteristics between the output transistors, the basic operational characteristics of the push/pull output circuit configuration, and non-linear behavior of the load itself. The classic or predominant method of reducing the non-linearities and error in the output signal is to degeneratively feed back a portion of the output signal to the input of the amplifier so that a portion of the output error is cancelled as the input signal is amplified through the amplifier. Typically, this degenerative feedback is accomplished using a resistive network, such as resistors $R_{f1}$ and $R_{f2}$ in FIG. 1.

While degenerative or negative feedback is effective for reducing errors and non-linearities, a practical limit exists beyond which feedback-related problems are introduced into the output signal, these problems including instabilities, phasing problems, and transient distortions. The introduction of these feedback-related problems generally outweighs the error-reducing increment obtained by increased negative feedback. Because of these well recognized practical limitations beyond which negative feedback is not desirable, a "residuim" of error typically exists in the output signal, with also, a finite positive output impedance.

FIG. 2 illustrates an amplifier topology in accordance with the present invention by which the residuum of error not reduced by conventional negative feedback techniques is removed from the output signal by a combination of complemented negative and positive feedback to provide a distortion-free amplified output. As shown in FIG. 2, the improved amplifier topology includes a differential input current source amplifier A1' and an output power amplifier A2' that includes first and second complementary MOSFET devices Q3 (N-channel) and Q4 (P-channel) connected in a symmetrical grounded source configuration with inter-gate bias provided by a biasing circuit B1'. As in the case of the amplifier topology of FIG. 1, the output devices are preferably biased for class AB operation, although variations from class AB operation are possible. The drains of the output devices Q3 and Q4 are connected through bilateral power supplies PS1 and PS2 to the load impedence L'. The inventive grounded source configuration for the output stage provides high input impedence and low ouput impedance.

As in the case of the circuit of FIG. 1, the minor portion of the error and distortion in the amplified signal is introduced by the input differential amplifier A1' which typically operates in a linear class A mode while the major portion of the error and distortion is introduced into the amplified output signal by the non-linearities in the output transistors Q3 and Q4, differences between the transfer characterisitcs of the two output transistors Q3 and Q4, the push/pull circuit configuration itself, and the load.

As shown in FIG. 2, the input signal to be amplified is provided to the inverting input of the input amplifier A1' which provides an inverted output signal to the output power amplifier A2' which is effective to reinvert the signal to its original input phase. In accordance with the present invention, a feedback network comprising inpedances $R_a$, $R_b$, $R_c$ and $R_d$ is provided to effect error and distortion correction by complementary degenerative and regenerative feedback in such a way that the error and distortion is removed and by which the output stage assumes desirable transresistive characteristics. A first negative or degenerative feedback loop is provided about the output stage from the output node E through an impedance $R_a$ to a voltage node D. The inverse signal feedback through impedance $R_a$ is effective to yield a classic current summation at node D thereby reducing the power gain of the output stage A2' in a known manner and to inject the output signal error and distortion to effect substantial, though not complete, error and distortion reduction as the signal is amplified through the output stage A2'. The amount of error and distortion reduction depends upon the amount of degenerative feedback provided through the impedance Ra, and is very close to the open-loop gain of stage A2' materialized into the load. Undistorted output voltages of stage A2' produce currents through Ra that sum with those from the current source so as to leave only that voltage at this node required to drive the stage A2' to equilibrium. However, errors produced by stage A2' produce currents in Ra which have no current to sum against. Hence all error voltage at the output of A2' will arrive fully unopposed at the node D. This is equivalent to the observation that the output impedance of the current source is near-infinite. It is also thus true that stage A1' would have near-infinite gain if Ra were not present.

A second degenerative feedback is provided through feedback impedance Rb to feed a portion of the error and distoration-containing output signal to the non-inverting input of the differential input amplifier A1'. While the output signal is in phase with the input signal to be amplified, by providing the feedback signal through Rb to the non-inverting input of the input amplifier A1', degenerative error and distortion reduction is effected in a manner analogous to that achieved by the first degenerative feedback loop.

In accordance with the present invention, a positive or regenerative feedback loop is provided from node D, having the "visible" inverse, intra-loop error superposed on the signal, which is inverted itself, at node D. Thus the error is actually in true phase to the A2' stage output error in this case. This feedback through feedback impedance Rc will be seen to be so connected to the non-inverting input of input amplifier A1', as to establish a positive or regenerative feedback loop around the input amplifier A1'. Accordingly, in amplifier A1', the signal at node D (which signal includes the amplified input signal and the raw distortion contribution of the output stage) is regeneratively enhanced to serially cancel the error and distortion as the signal is amplified. In effect, by feeding back a portion of the signal at node D to the input of amplifier stage A1' as positive feedback, the input signal is precorrected or pre-distorted with the regeneratively enhanced error signal serially cancelling the error of A2'. The error correcting effect is such that the amount of positive feedback can be controlled by Rc to completely null the output error or, if desired, overcorrect. Thus, by appropriate control of the positive feedback signal from node D to the input of amplifier A1', it is possible to null completely the 'residual' error not eliminated by the classic degenerative feedback loops. The present invention provides an amplifier topology in which the error is corrected by complemented positive and negative feedback to achieve distortion and error-free output. One advantage of the inventive topology is that the amount of negative feedback previously used can be radically reduced since the residuum of error and distortion not reduced by the negative feedback loop or loops can be removed by the complementary positive feedback. A reduction in the hitherto used levels of negative feedback reduces or eliminates negative feedback related problems including gain reduction, instabilities, and serious transient related distortions.

The combination of grounded source output MOSFETs, which are basically linear transconductive devices, a bilateral current source driving stage, and the negative feedback path through Ra has the effect of inverting, from a functional standpoint, the output stage from its transconductive mode to a transresistive mode by which changes in input current, as provided into Ra, cause proportional changes in output voltage. The output stage takes on antisotropic properties, that is, it acts like a common or grounded source stage that provides full forward voltage gain but has, looking back from the load, the properties of a common-drain source follower. This result allows the driver stage to operate on substantially lower voltage and yet permits greater dynamic 'headroom' for the driver stage and reduces or eliminates the problem of concurrent output stage and driver saturation. Because the driver stage can operate on lower voltages, driver slew rate times are significantly improved resulting in greater high speed effectiveness.

A practical and preferred embodiment of an audio-frequency range amplifier in accordance with the present invention which exhibits quantitative output performance that is substantially free of distortion and further exhibits superior qualitative or sonic performance is illustrated in FIG. 3 and is generally referred to therein by the reference character 10. The amplifier 10 includes a signal input stage that includes first and second MOSFET transistors Q5 and Q6 of the same conductivity type (N-channel) configured as a differential input, single output amplifier with the sources of the transistors Q5 and Q6 connected, respectively, through gain-controlling resistors R1 and R2 to biasing resistor R3 to the negative supply. The resistor R3 provides a relatively constant-current source biasing to the transistors Q5 and Q6. As an alternative, the resistor R3 may be replaced by a current regulator diode. The drain of the transistor Q5 is connected to the positive power source through R8, while the drain of the transistor Q6 provides the output signal to the next amplifier stage to be described below. The signal input to the amplifier is provided through an input connector S1 through a resistor-capacitor network consisting of resistors R4 and R5 and a capacitor C1, and a resistor R6 to the gate of the transistor Q5. Another resistor R7 is provided from the connector S1 to chassis ground. The various input resistors and capacitor define a low-pass RF suppression circuit. Diodes D1 and D2 are provided from the input signal line between resistors R5 and R6 to the positive and negative power supplies to act as protective voltage clamps to limit the gate-to-source voltage of the MOSFET transistor Q5. A positive going input voltage at the gate of transistor Q5 will cause the current there through to increase and that through the other transistor Q6 to differentially decrease and the voltage at the drain of Q6 to increase and follow the changes in the input gate voltage. The signals applied to the gate of transistor Q6 effect error correction of the input signal as discussed more fully below.

The signal from the drain of Q6 is provided to the input bilateral current source defined by complementary MOSFET transistors Q7 (P-type) and Q8 (N-type). Biasing is provided through gate low-pass resistors R9 and R10, by a Zener diode ZD3 bypassed capacitors C2 and C3, and resistors R11 and R12 to the positive and negative power supplies. The transistors Q7 and Q8 are biased for a class A operation. The signal from the drain of transistor Q6 is applied through the above-described circuit elements to the gates of transistors Q7 and Q8. The sources of the transistors Q7 and Q8 are connected to the positive and negative power supplies through resistors R13 and R14 which have a current limiting function to provide for optimized bilateral current source operation.

The drains of the transistors Q7 and Q8 are connected to a voltage node D diodes D4, D5, and D6, and adjustment potentimeter POT 1. The drain connection at the voltage node D has a near infinite output impedance with this node including the full signal being applied to the output stage. Since the signal being applied to the output stage is provided through a relatively linear class A input amplifier and a biateral class A currents source stage, its distoration component is relatively low.

The output stage includes first and second complementary MOSFET transistors Q9 (N-channel) and Q10 (P-channel) in a common source push/pull configuration with the drains of the transistors Q9 and Q10 connected to an output node 'OUT' through bilateral power supplies PS1' and PS2', capacitors C4 and C5, and protective fuses F1 and F2. The gate of the output transistor Q9 is connected through a resistor R15 to the drain of the transistor Q7, and the gate of the output transistor Q10 is connected through a resistor R16 and the potentiometer POT 1 to the drain transistor Q8. Inter-gate biasing between the output transistors Q9 and Q10 is established by the diode series D4, D5 and D6 as modified by adjustment of the potentiometer POT 1. The capacitor C6 is provides for RF suppression. Suitable commercially available output transistors are the Hitachi 2SK135 (N-channel) and the Hitachi 2SJ50 (P-channel).

A first degenerative feedback loop is provided about the output stage through resistor R17 and capacitor C7 which capacitor provides phase-leading in the feedback signal. This feed-back loop introduces a selected fraction of the output signal with all of its error voltage to the voltage node D where the output signal error is superposed onto the input signal passing forwardly through node D for amplification by Q9 and Q10. As is known, the distortion component is greatly minimized as a result of the degenerative feedback through R17, although from a practical standpoint, a 'residuum' of error is left since A2' has finite gain. In addition to this first degenerative feedback loop about the output amplifier stage, a second degenerative feedback loop is provided through resistor R18 and phase-lead capacitor C5 through resistor R19 to the gate of the transistor Q6 to provide negative feedback in the usual manner.

The voltage appearing at voltage node D includes the low distortion signal to be amplified provided through Q7 and Q8 and the superposed highly "visable" distortion component of the output amplifier stage fed back through R17 and C7, (and also through R18 and C8). Thus, at point D, a voltage representative of the distortion contribution of the output stage is present with the inverted signal to be amplified. In accordance with the present invention, a portion of the signal from node D is fed back to the gate of Q6 through resistors R20 and R19 as positive or regenerative feedback, which is then regenerated through the Q7/Q8 current source. The potenimeter POT2 and resistor R21 permit adjustment of the Q5 and Q6 gate offset.

The overall effect is that the input signal is pre-corrected in Q6, Q7, Q8 with the regeneratively enhanced error contribution of the output stage from voltage node D so that this pre-correction signal, when passed through Q9 and Q10 is effective to serially cancel the residuum of error not reduced by the negative feedback. This positively regenerative feedback feature is fully effective to null the residuum to provide an error-free output signal. Should it be desired, it is possible to even overcorrect or overnull the output by increasing the positive feedback.

The voltage drop across the feedback resistor R17 is representative of the output current flowing through the Q9/Q10 output stage and the load and reflects imperfections in this current caused by the Q9/Q10 output stage as well as imperfections caused by the load. These load induced current imperfections are part of the error signal fed back through R17 (and R18) superposed on the forwardly propagating signal at the voltage node D.

As can be appreciated by those skilled in the art, when using conventional negative feedback techniques, the amount of feedback, from a practical standpoint is always slightly insufficient to effect total error elimination. In accordance with the present invention, the signal at the voltage node, at which the error contribution of the output stage is superposed on the input signal as it propagated forwardly through the amplifier, is used in a regenerative manner to pre-correct the input signal to the required level to complement the always slightly insufficient error correction obtained by negative feedback techniques.

As will be apparent to those skilled in the art, various changes and modifications may be made to the distortion-free complemented error feedback amplifier of the present invention without departing from the spirit and scope of the invention as recited in the appended claims and their legal equivalent.

Expanding the spirit of the last paragraph, it should be noted that a suitable version of complement feedback is applicable to improve a classic degenerative feedback connection in virtually any amplifier, as inverse "intra-loop" error is always present.

What is claimed is:

1. An amplifier for amplifying an electric signal, said amplifier comprising:
   a signal path extending between an input port and an output port;
   a signal node in said signal path between said input and said output port;
   first amplification means in said signal path connected between said input port and said signal node for amplifying an input signal applied to said input port and for providing the so-amplified signal to said signal node;
   another amplification means in said signal path connected between said signal node and said output port for amplifying a signal from said signal node, said other amplification means providing the so-amplified signal and any signal error introduced by said other amplification means to said output port;
   a degenerative feedback loop means connected between said signal path on the output port side of said other amplification means and said signal node for degeneratively feeding back a portion of the signal amplified by said other amplification means and any introduced signal error to said signal node for combination with the signal at said signal node to at least effect a reduction in the signal error at the output of said other amplification means by degeneration; and
   a regenerative feedback loop means connected between said signal node and said signal path on the input port side of first amplification means for regeneratively feeding back a portion of the signal and signal error at said signal node to said signal path on the input port side of said first amplification means to alter the input signal prior to amplification by said first amplification means with a portion of the signal error introduced by said other amplification means present at said signal node, whereby the so-altered input signal is effective to at least cause a reduction in the signal error at the output port as the so-altered input signal is propagated along the signal path to the output port.

2. The amplifier claimed in claim 1 further comprising:
a third feedback loop means connected between the signal path on the output port side of said other amplification means and said signal path on the input port side of said first amplification means for effecting degenerative feedback.

3. The amplifier claimed in claim 1 wherein:
said other amplification means inverts the signal from said signal node during amplification thereof and said degenerative feedback loop means applies a portion of the so-inverted signal to said signal node to thereby effect degenerative signal error reduction in said other amplification means.

4. The amplifier claimed in claim 3 wherein:
said first amplification means amplifies the input signal with reversal of phase thereof and said regenerative feedback loop means includes impedance means through which a portion of the signal at said signal node passes to said signal path on the input port side of said first amplification means for effecting regenerative feedback.

5. The amplifier claimed in claim 3 wherein:
said first amplification means inverts the input signal during amplification thereof and said regenerative feedback loop means include means for applying a portion of the signal at said signal node to said signal path on the input port side of said first amplification means substantially in phase with the input signal for effecting regenerative feedback.

6. An amplifier for amplifying an electric signal, said amplifier comprising:
a first and a second amplifier means each having respective input ports for accepting a signal to be amplified and respective output ports for providing the so-amplified signal thereto;
a signal node connected to the output port of said first amplifier means and to the input port of said second amplifier means;
a first feedback means connected between the output port of said second amplifier means and said signal node for degeneratively feeding back a portion of the signal amplified by said second amplifier means and any signal error introduced by said second amplifier means from the output port of said second amplifier means to said signal node to combine with the signal at said signal node and at least degeneratively reduce the signal error contribution of said second amplifier means; and
a second feedback means connected between said signal node and the input port of said first amplifier means for regeneratively feeding back a portion of the signal and any signal error at said signal node to the input port of said first amplifier means to at least alter an input signal with a portion of the signal error contribution of said second amplifier means present at said signal node.

7. An amplifier for amplifying an electric signal, said amplifier comprising:

a first amplification means having an input port for accepting an input signal having an initial phase for out-of-phase amplification of the input signal and having an output port to which the out-of-phase amplified signal is provided;
a signal node connected to the output port of said first amplification means and to which the out-of-phase amplified signal is provided from said first amplification means;
another amplification means having an input port connected to said signal node for accepting the out-of-phase signal provided thereto from said first amplification means and for effecting inverse phase amplification of said out-of-phase signal and having an output port to which said initial-phase-restored amplified signal and any signal error introduced by said other amplification means is provided;
a first feedback means connected between the out-put port of said other amplification means and said signal node for providing a portion of the initial-phase-restored output signal and any signal error introduced by said other amplification means to the out-of-phase signal at said signal node to at least degeneratively reduce the signal error contribution of said other amplification means; and
a seocnd feedback loop means connected between said signal node and the input port of said first amplification means for regeneratively feeding back a portion of the signal and any signal error introduced by said other amplification means at said signal node to the input port of said first amplification means to at least alter the initial phase input signal with a portion of the signal error present at said signal node.

8. An amplifier for amplifying an electric signal, said amplifier comprising:
a first amplification means having an input port for accepting an input signal of an initial phase for inverse phase amplification of the input signal and having an output port to which the inverse phase amplified signal is provided;
a signal node connected to the output port of said first amplification means and to which the inverse phase amplified signal is provided from said first amplification means;
another amplification means having an input port connected to said signal node for accepting the inverse phase signal provided thereto from said first amplification means and for effecting inverse phase amplification thereof to thereby restore the signal to the initial phase and having an output port to which said initial-phase-restored amplified signal and any signal error introduced by said other ampliftction means is provided;
a first feedback means connected between the output port of said other amplification means and said signal node for providing a portion of the initial-phase-restored output signal and any signal error introduced by said other amplification means to the signal node to at least degeneratively reduce the signal error contribution of said other amplification means; and
a second feedback means connected between said signal node and the input of said first amplification means for regeneratively feeding back a portion of the signal and and signal error introduced by said second amplifier at said signal node to the input port of said first amplification means to at least alter the initially phased input signal with a portion of the signal and any signal error introduced by said second amplifier present at said signal node to at least effect error reduction as the so-altered input signal is propagated through said other amplifier means.

9. An amplifier for amplifying an electric signal, said amplifier comprising:
   a differential input amplifier means having an inverting input, a non-inverting input, and an output;
   a signal node connected to said differential input amplifier means output;
   said differential input amplifier means inverting an input signal having an initial phase applied to said inverting input and providing the so-inverted signal to said signal node;
   another amplifier means having an input connected to said signal node for amplifying the re-inverting the signal to its initial phase and providing that re-inverted signal and any signal error introduced by said other amplifier means to an output port;
   a first feedback loop means connected between the output port and said signal node for feeding back a portion of the output signal and any signal error introduced by said other amplifier means to the signal node to superpose output signal error onto the signal at the signal node and to effect degenerative reduction of the output signal error; and
   a second feedback loop connected between the signal node and the non-inverting input of said differential input amplifier means to effect regenerative feedback of the error superposed on the signal at the signal node to at least alter the input signal to effect error reduction as the so-altered signal is propagated through the other amplifier means.

10. The amplifier claimed in claim 6, 7, 8, or 9 further comprising:
    a third feedback loop means connected between the output port of said second-mentioned amplifier means and said input of said first amplifier means to effect degenerative feedback.

11. The amplifier claimed in claims 6, 7, 8, or 9 wherein said second-mentioned amplifier means comprises:
    first and second MOSFET devices of complementary type configured in a symmetrical common source amplifier circuit with their respective drains connected through oppositely poled power supply means to the output port and with inter-gate biasing means provided to bias the gates of the first and second MOSFET devices to a selected class of amplification.

12. An amplifier for amplifying an electrical signal, said amplifier comprising:
    a signal path extending between an input port and an output port; a first and a second amplifier means in the signal path; the first amplifier means connected for accepting an input signal applied to the input port, the second amplifier means connected to provide an output signal to the output port, and the first and second amplifier means connected in circuit with one another so the second amplifier means accepts the signal provided by the first amplifier means; a feedback loop means connected to the signal path to provide a portion of signal output of the second amplifier means and any signal error introduced by the second amplifier means to the circuit connection connecting the first and second amplifier means to effect negative feedback about the second amplifier means; and another feedback loop means connected between the circuit connection connecting the first and second amplifier means and the signal path to provide a portion of the signal and any signal error introduced by the second amplifier means at the circuit connection as positive feedback to the first amplifier means.

13. A method of amplification of electrical signals that provides an error corrected amplifier output, said method comprising:
    providing an input signal to be amplified to the input port of first amplifier means;
    amplifying the input signal through the first amplifier means and providing the amplified input signal to a signal node;
    providing the signal from the signal node to a second amplifier;
    amplifying the signal from the signal node through the second amplifier and providing the so-amplified signal and any signal error introduced by the second amplifier to an output port for connection to a load;
    feeding back a portion of the output signal from the output port in a degenerative manner to the signal node to superpose the output signal and any output signal error onto the signal at the signal node and to effect degenerative error reduction as the superposed signals are propagated through the second amplifier means to the output port; and
    feeding back a portion of the signal from the signal node to the input port of the first amplifier means in a regenerative manner to alter the input signal with output signal error from the signal node to thereby regeneratively enhance the input signal to effect output error reduction as the regeneratively enhanced input signal is propagated to the output.

14. An amplifier for amplifying an electric signal, said amplifier comprising:
    a first amplifier means of a trans-conductive bilateral current source type having an input port for amplifying an input signal provided to the input port and having an output port of high impedance;
    a signal node connected to the output port of said first amplifier means for receiving the signal provided therefrom;
    another amplifier means having an input port connected to said signal node for amplifying the signal therefrom and providing the so-amplified signal to an output port for connection to a load, said other amplifier means including first and second MOSFET devices of complementary type having source, drain, and gate terminals configured in a symmetrical common source circuit with their respective drains connected through oppositely poled power supply means to the output port of said other amplification means and biasing means for providing intergate biasing for a selected class of operation; and
    feedback loop means connected between the output port of said other amplifier and said signal node for degeneratively feeding back a portion of the output signal from the output port to the signal node to cause a signal voltage there which is representative of the current through the other amplifier means any load connected to the output port and also cause a current signal thereat representative of the output port voltage.

15. The amplifier claimed in claim 14 further comprising:
a second feedback loop means connected between said signal node and the input port of said first amplifier means for regeneratively feeding back a portion of the signal at said signal node to the input port of said first amplifier means to effect regeneration of the feedback signal as it is propagated through the amplifier.

16. The amplifier claimed in claim 15 further comprising:
a third feedback loop means connected between the output of said other amplifier means and the input port of said first amplifier means for effecting degenerative feedback.

* * * * *